Dec. 19, 1967 R. S. OWINGS 3,359,360

ELECTRONIC COMPONENT ASSEMBLY INCLUDING A MOUNTING BRACKET WITH REMOVABLE LOOPS

Filed March 1, 1965

Robert S. Owings
INVENTOR.

BY John E. Vandigriff

United States Patent Office 3,359,360

Patented Dec. 19, 1967

3,359,360

ELECTRONIC COMPONENT ASSEMBLY INCLUDING A MOUNTING BRACKET WITH REMOVABLE LOOPS

Robert Stanley Owings, Dallas, Tex., assignor to Texas Instruments Incorporated, Dallas, Tex., a corporation of Delaware Filed Mar. 1, 1965, Ser. No. 435,884

2 Claims. (Cl. 174—52)

This invention relates to a mounting bracket for electronic components and more particularly to the method of making same.

With the advent of mass production and automation in the assemblying of parts and components for complex electrical and electronic equipment, the standardization of design has become a necessity. A great number of parts must be easily assembled and interchangeable with like units for ease in assembly and maintainence. Several approaches have been made in mass production to eliminate point-to-point wiring of electronic assemblies and apparatus. For example, terminal boards and strips with rows of solder terminals have been used to mount components thereon and facilitate wiring of the apparatus. These boards and strips have been made out of phenolic, Fiberglas and other insulating materials with copper laminated to each side thereof and then etched to remove portions of the copper to form intricate patterns of wiring and to provide terminations to which electronic components may be attached.

In all of the above methods, each individual component has to be soldered to terminals, and the stability and rigidity of the component then depends upon the strength of the connection of the lead wires to the terminal posts. Dimensional tolerances necessarily depend upon accurate placement of the components by hand. Application of heat to the lead wires of the various components during soldering may seriously damage the components and hasten their failure. The use of such laminated boards adds to the cost of production, and does not readily lend itself to bonding of the components to the boards by welding to avoid unnecessary heating.

An object of the present invention is to provide a method of mounting electronic components and encapsulating them, during which dimensional tolerances are maintained.

Another object of the invention is to provide a method of mounting components upon preformed parts which have constructed integrally therewith mounting tabs which may be used after assembly.

Still another object of the invention is a mounting bracket which facilitates the welding of electronic components thereon and adds mechanical strength to the finished package.

Another object of the invention is a mounting bracket which provides protection for the components mounted thereon prior to use.

A still further object of the invention is an electronic assembly having one or more electronic components mounted on the bracket above mentioned, the bracket furnishing strength to the assembly during manufacture with the bracket being later separated into two major parts for subsequent use of the assembly.

A feature of the invention is a method of making electronic assemblies which provides a shorting path around the components during welding to minimize damage to the components from welding currents.

Other objects and features of the invention will become more readily understood from the following detailed description and appended claims when considered in conjunction with the accompanying drawing, in which like reference numerals designate like parts throughout the figures thereof, and in which:

Figure 1:
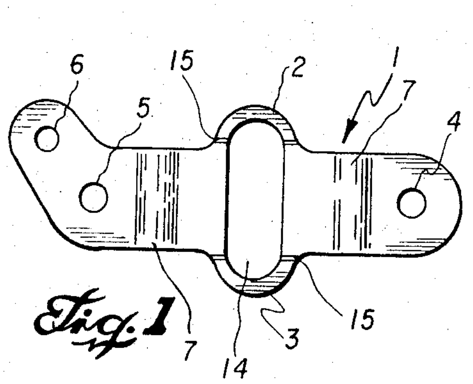
FIGURE 1 is a drawing of the top view of the mounting bracket which may be used in the production of electronic assemblies.
Figure 2:
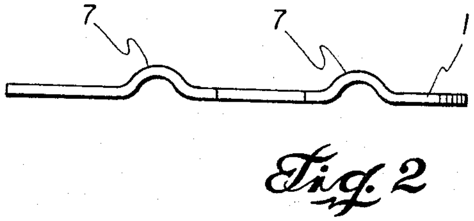
FIGURE 2 is a side elevation of the mounting bracket shown in FIGURE 1.

Referring to the figures in detail, FIGURES 1 and 2 show a mounting bracket which may be formed, for example, by stamping the bracket out of sheet metal. In the stamping process, mounting holes 4, 5 and 6 are punched therein and the raised portions 7 are formed. The center portion of the bracket has an opening 14 which separates one end of the bracket from the other, the two ends being held together by the loops 2 and 3, which project out beyond the sides of the bracket. The loops 2 and 3 may be weakened along lines 15 for reasons which will be explained hereinafter. This weakening may be accomplished during the stamping process by pinching the bracket on both sides along the lines 15.

Figure 3:
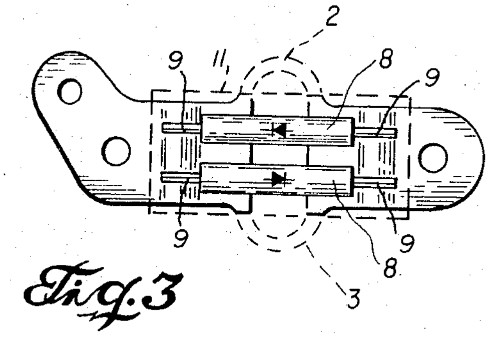
FIGURE 3 is a top view of the mounting bracket with electronic components mounted thereon.
Figure 4:
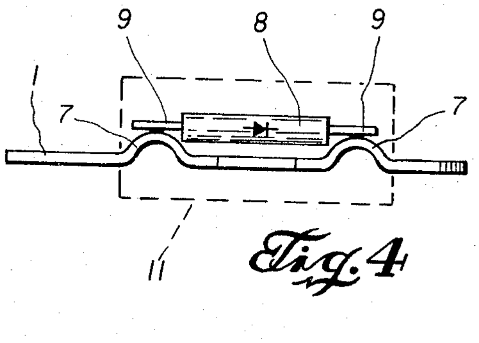
FIGURE 4 is a side elevation of the mounting bracket with electronic components mounted thereon shown in FIGURE 3.

FIGURES 3 and 4 are top and side views of the mounting bracket after electronic components 8 have been mounted thereon, the leads 9 of each of the components being secured to the raised portions 7 of the bracket. While this may be accomplished by several methods, the preferred method is spot welding. The loops 2 and 3 provide short circuits around the components, thereby minimizing the possibility of damaging the components by welding currents. The components shown in the figures represent diodes; however, they may be any other component.

After the diodes have been welded to the raised portions 7, the assembly is encapsulated in plastic or epoxy material, for example, Hysol Type XC8–C817, leaving holes 4, 5 and 6 exposed and the loops 2 and 3 beyond the weakened portions represented by the lines 15 also exposed. When encapsulation is complete, the loops 2 and 3 are removed by breaking or cutting them along the weakened portion 15, thereby removing the short circuits from around the components. The welding of the leads and the encapsulation of the unit add to the mechanical strength of the finished package and maintain dimensional tolerances of the overall assembly, whereby like units may be interchanged without variation of the positions, for example, of the mounting holes 4, 5 and 6.

In some cases it may be desirable to leave the loops 2 and 3 on the bracket until the assembly is ready for installation. Some components, for example microwave diodes, may be damaged by handling. It is not unusual for the human body to build up static charges which may damage the diode if the static charge were discharged through the diode. For this reason the loops may be left on the bracket to provide a short circuit around the diode until the assembly is ready for installation or even until after it has been installed.

Figure 5:
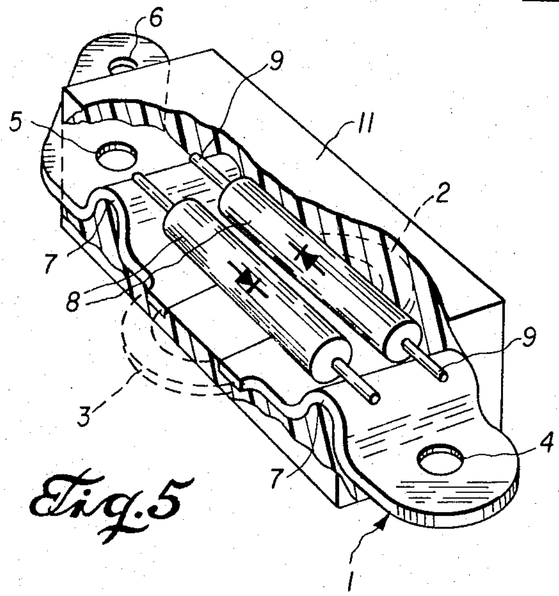
FIGURE 5 is a pictorial representation illustrating the completed electronic assembly, with the two components mounted on the bracket with the connecting loops between the two major parts of the bracket removed and both components and bracket encapsulated within a suitable encapsulant.

FIGURE 5 is a pictorial view of the finished assembly with part of the encapsulant 11 removed to show the location of the components 8 upon the bracket 1 after encapsulation, and after the loops 2 and 3 have been removed. Individual components may be mounted on the bracket to afford a rigid encapsulating unit, protecting the device and providing it with suitable mounting tabs.

Although the present invention has been shown and illustrated in terms of a specific preferred embodiment, it will be apparent that changes and modifications are possible without departing from the spirit and scope of the invention as defined in the appended claims.

What is claimed is:

1. An electronic component assembly comprising a mounting bracket having two major parts spaced apart by two loop members, each of said major parts having holes therethrough and a projection on one face thereof, at least one electronic component mounted on said bracket and attached to said projections, and an encapsulating material enclosing said component and a portion of said bracket, said loop members extending beyond and being free of encapsulating material.

2. An assembly according to claim 1, wherein said encapsulating material is a solid insulator contacting said electronic component.

References Cited

UNITED STATES PATENTS

| | | | |
|---|---|---|---|
| 907,911 | 12/1908 | Stewart | 174—53 |
| 2,160,716 | 5/1939 | Bentley | 174—53 |
| 2,486,065 | 10/1949 | Saucet | 174—50.63 X |
| 2,613,252 | 10/1952 | Heibel. | |
| 2,778,869 | 1/1957 | Bentley | 174—53 |
| 2,883,447 | 4/1959 | Dahl. | |
| 3,216,089 | 11/1965 | Dettman. | |

OTHER REFERENCES

I.B.M. Technical Disclosure Bulletin, "Self-Lugged Stamped Wiring," I. Buckminster, vol. 1, No. 5, February 1959.

LARAMIE E. ASKIN, *Primary Examiner.*

LEWIS H. MYERS, *Examiner.*

H. W. COLLINS, *Assistant Examiner.*